United States Patent
Umezaki et al.

(10) Patent No.: US 9,165,776 B2
(45) Date of Patent: Oct. 20, 2015

(54) DRY ETCHING METHOD

(75) Inventors: Tomonori Umezaki, Ube (JP); Isamu Mori, Ube (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 14/238,639

(22) PCT Filed: Aug. 8, 2012

(86) PCT No.: PCT/JP2012/070154
§ 371 (c)(1),
(2), (4) Date: Feb. 12, 2014

(87) PCT Pub. No.: WO2013/035476
PCT Pub. Date: Mar. 14, 2013

(65) Prior Publication Data
US 2014/0206196 A1    Jul. 24, 2014

(30) Foreign Application Priority Data

Sep. 7, 2011   (JP) .................................. 2011-195359
Dec. 6, 2011   (JP) .................................. 2011-267110

(51) Int. Cl.
*C03C 15/00*   (2006.01)
*H01L 21/306*   (2006.01)
(Continued)

(52) U.S. Cl.
CPC ........ *H01L 21/306* (2013.01); *H01L 21/32137* (2013.01); *H01L 27/11556* (2013.01); *H01L 27/11582* (2013.01)

(58) Field of Classification Search
USPC ........ 216/37, 58, 67; 438/636, 645, 695, 710, 438/723, 724
See application file for complete search history.

(56) References Cited

U.S. PATENT DOCUMENTS 5,624,582 A * 4/1997 Cain .............................. 438/715
6,204,184 B1 * 3/2001 Nishida et al. ................ 438/692
(Continued)

FOREIGN PATENT DOCUMENTS

JP    2008-103689 A    5/2008
JP    2010-509081 A    3/2010
(Continued)

OTHER PUBLICATIONS

International Search Report (PCT/ISA/210) with English translation dated Oct. 2, 2012 (Five (5) pages).
(Continued)

*Primary Examiner* — Duy Deo
*Assistant Examiner* — Maki Angadi
(74) *Attorney, Agent, or Firm* — Crowell & Moring LLP

(57) ABSTRACT

There is provided according to the present invention a dry etching method for a laminated film, the laminated film being formed on a substrate and having a laminated structure in which silicon layers and insulating layers are laminated together with a hole or groove defined therein in a direction perpendicular to a surface of the substrate, the dry etching method comprising etching, with an etching gas, parts of the silicon layers appearing on an inner surface of the hole or groove, characterized in that the etching gas comprises: at least one kind of gas selected from the group consisting of $ClF_3$, $BrF_5$, $BrF_3$, $IF_7$ and $IF_5$; and $F_2$. It is possible by such a dry etching method to prevent non-uniformity of etching depth between the silicon layers.

7 Claims, 1 Drawing Sheet

(51) Int. Cl.
*H01L 21/3213* (2006.01)
*H01L 27/115* (2006.01)

(56) References Cited

U.S. PATENT DOCUMENTS

| | | | |
|---|---|---|---|
| 6,800,210 B2 * | 10/2004 | Patel et al. | 216/2 |
| 7,696,569 B2 | 4/2010 | Fujimoto et al. | |
| 8,207,029 B2 | 6/2012 | Ishikawa | |
| 8,278,725 B2 | 10/2012 | Tripathy et al. | |
| 8,440,568 B2 | 5/2013 | Ugajin | |
| 2002/0195423 A1 | 12/2002 | Patel et al. | |
| 2008/0073709 A1 | 3/2008 | Fujimoto et al. | |
| 2010/0193781 A1 | 8/2010 | Tripathy et al. | |
| 2010/0197129 A1 | 8/2010 | Ishikawa | |
| 2010/0240218 A1 | 9/2010 | Ugajin | |

FOREIGN PATENT DOCUMENTS

| | | |
|---|---|---|
| JP | 2010-177652 A | 8/2010 |
| JP | 2010-225694 A | 10/2010 |
| JP | 2011-60958 A | 3/2011 |
| KR | 10-1999-0078281 A | 10/1999 |
| KR | 10-2010-0105398 A | 9/2010 |

OTHER PUBLICATIONS

Gregory T.A. Kovacs, "Bulk Micromachining of Silicon", Proceedings of the IEEE, vol. 86, No. 8, pp. 1536-1551, 1998, (Sixteen (16) pages).

Hisashi Ichikawa, "Topography Simulation Technology for BiCS Ultrahigh-Density Flash Memory", Toshiba Review, vol. 66, No. 5, pp. 29-33, 2011, including partial English translation (Five (5) pages).

European Search Report dated Dec. 10, 2014 (six pages).

Saito et al. "Plasmaless etching of silicon using chlorine trifluoride" Department of Electric and Electronic Engineering, Toyohashi University of Technology, Toyohashi, 441 Japan, Sep. 1, 1991, pp. 2503-2510, vol. 9, No. 5, 8257b Journal of Vacuum Science & Technology, New York, US, XP 000272736.

Ibbotson et al. "Plasmaless dry etching of silicon with fluorine-containing compounds" Journal of Applied Physics, Nov. 15, 1984, pp. 2939-2942, vol. 56, No. 10, American Institute of Physics, XP 002910845.

Korean Office Action dated Nov. 26, 2014 (three pages).

Taiwanese Office Action dated Jan. 14, 2015 (Four (4) pages).

* cited by examiner

DRY ETCHING METHOD

TECHNICAL FIELD

The present invention relates to dry etching of a silicon layer of a three-dimensional structural element formed on a substrate.

BACKGROUND ART

High integration of semiconductor devices has been progressed year after year. Heretofore, fine processing techniques for reduction of circuit line widths have been developed because there is a need to increase the number of semiconductor elements integrated per unit area for the purpose of increasing the integration of the semiconductor devices. It has however been pointed out that malfunctions increase when fine processing of semiconductor devices proceeds excessively.

Under such circumstances, there have recently been developed three-dimensional structural semiconductor devices in which structural elements are arranged in directions parallel and perpendicular to substrate surfaces (see Patent Document 1). In the three-dimensional structural semiconductor device, the structural elements are arranged on the substrate of e.g. single crystal silicon not only in the direction parallel to the substrate surface as in conventional techniques but also in the direction perpendicular to the substrate surface by alternately laminating silicon electrode films and insulating films in plural layers on the substrate, subjecting the resulting laminated film to anisotropic etching such as reactive ion etching so as to form a plurality of fine holes or grooves of the order of 20 to 200 nm through the laminated film, and then, processing the shapes of parts of any specific layers (e.g. silicon electrode layers) appearing on inner surfaces of the holes or grooves For examples, it has been reported to manufacture large-capacity BiCS memories by plasma etching BiCS memory holes through Si electrode layers and silicon oxide insulating layers.

The specific layers appearing on the inner surfaces of the holes need to be processed by etching treat so as to impart the functionality of capacitors or transistors. There are known, as such etching treatment, a wet etching process using a liquid medicine having selective reaction characteristics against the specific layers and a dry etching process using a gas having selective reaction characteristics against the specific layers.

In the case of dry etching of silicon layers appearing on inner surfaces of fine holes in a three-dimensional structural element, the etching needs to be performed in a direction parallel to substrate surface. For such etching treatment, it is common practice to use $ClF_3$ or $XeF_2$ gas capable of isotropic etching (see Non-Patent Document 2).

PRIOR ART DOCUMENTS

Patent Documents

Patent Document 1: Japanese Laid-Open Patent Publication No. 2010-225694

Non-Patent Documents

Non-Patent Document 1: Hisashi Ichikawa, Toshiba Review, vol. 66, no. 5 (2011)
Non-Patent Document 2: Gregory T. A. Kovacs, Proceedings of the IEEE, vol. 86(8), pp. 1536-1551, 1998

SUMMARY OF THE INVENTION

Problems to be Solved by the Invention

In the conventional manufacturing of the three-dimensional structural semiconductor element as disclosed in Non-Patent Document 1, there is a high tendency that the plurality of specific layers, when processed by etching treatment, show variations in etching depth with decrease in hole diameter or groove width due to the reason that these specific silicon layers are located at different depths in the hole or groove. This makes it impossible to obtain uniformity of etching depth in the depth direction of the hole or groove (hereinafter also simply referred to as "etching depth uniformity") and becomes a cause of deterioration in device performance.

There has thus been a demand to develop an etching method for etching of specific layers appearing on inner surfaces of holes or grooves in such a manner that the etching depth can be independent of the width direction of the holes or grooves.

It is accordingly an object of the present invention to provide an etching method for etching of specific silicon layers appearing on inner surfaces of holes or grooves while preventing non-uniformity of etching depth in the depth direction of the holes or grooves.

Means for Solving the Problems

The present inventors have found as a result of extensive researches that, in the case of etching of silicon layers appearing on inner surfaces of holes or grooves, it is possible to prevent non-uniformity of etching depth in the direction of the holes or grooves by the use of a mixed gas in which $F_2$ is added to at least one kind of gas selected from the group consisting of $ClF_3$, $BrF_5$, $BrF_3$, $IF_7$ and $IF_5$ as an etching gas. The present invention is based on such a finding.

Namely, there is provided according to the present invention a dry etching method for a laminated film, the laminated film being formed on a substrate and having a laminated structure in which silicon layers and insulating layers are laminated together with a hole or groove defined therein in a direction perpendicular to a surface of the substrate, the dry etching method comprising etching, with an etching gas, parts of the silicon layers appearing on an inner surface of the hole or groove, wherein the etching gas comprises: at least one kind of gas selected from the group consisting of $ClF_3$, $BrF_5$, $BrF_3$, $IF_7$ and $IF_5$; and $F_2$.

The partial pressure of $ClF_3$, $BrF_5$, $BrF_3$, $IF_7$ or $IF_5$ in the etching gas is preferably in a range of 1 to 200 Pa. At least one kind of gas selected from $N_2$, He and Ar may be added to the etching gas. Further, it is preferable to bring the etching gas into contact with the substrate under the condition that the temperature of the substrate is −30 to 100° C.

In the case of the laminated film being formed on the substrate and having the laminated structure in which the silicon layers and the insulating layers are laminated together with the hole or groove defined therein in the direction perpendicular to the substrate surface, it is possible by the dry etching method of the present invention to etch the parts of the silicon layers appearing on the inner surface of the hole or groove while preventing non-uniformity of etching depth between the silicon layers in the depth direction of the hole or groove.

DETAILED DESCRIPTION OF THE EMBODIMENTS

Figure 1:
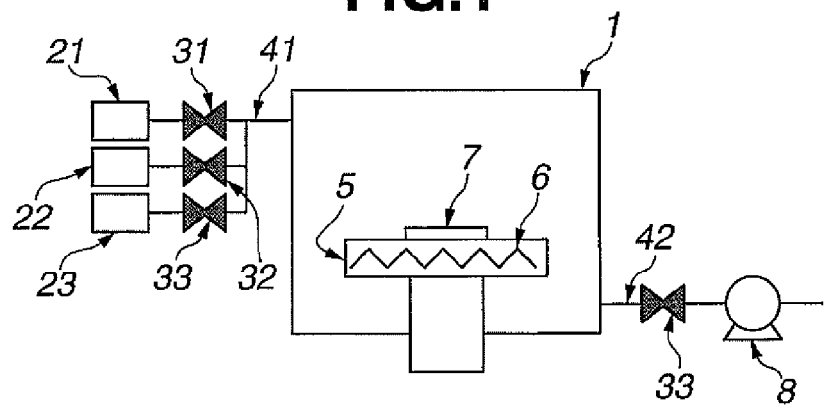
FIG. 1 is a schematic system diagram of an etching reaction apparatus to which the present invention is applicable.

The object to be processed by the dry etching method in the present invention is, in a laminated film having a laminated structure in which silicon layers and insulating layers are laminated together on a substrate with a hole(s) or groove(s) defined therein in a direction perpendicular to a surface of the substrate, parts of the silicon layers appearing on am inner surface(s) of the hole(s) or groove(s).

As the silicon layer, there can be used an amorphous silicon film, a polysilicon film, a single crystal silicon film or the like.

As the insulating layer, there can be used a silicon oxide film, a silicon nitride film, titanium nitride film or the like.

In the present invention, the dry etching method is performed with the use of an etching gas containing at least one kind of interhalogen selected from the group consisting of $ClF_3$, $BrF_5$, $BrF_3$, $IF_7$ and $IF_5$ and $F_2$. The etching gas is introduced to a reaction chamber in which the substrate is placed and is thereby brought into contact with the hole or groove defined on the substrate.

The partial pressure of each of $ClF_3$, $BrF_5$, $BrF_3$, $IF_7$, $IF_5$ and $F_2$ in the etching gas is preferably in a range of 1 to 2000 Pa, more preferably 5 to 1000 Pa, in order to obtain a high effect regarding etching depth uniformity.

The etching gas may contain at least one kind of diluent gas selected from $N_2$, He and Ar in addition to at least one of $ClF_3$, $BrF_5$, $BrF_3$, $IF_7$ and $IF_5$ and $F_2$. There is no particular limitation on the partial pressure of $N_2$, He, Ar in the etching gas. In view of the gas tightness of the general type of reaction chamber, the partial pressure of $N_2$, He, Ar is preferably set in such a manner that the total pressure of the etching gas does not exceed atmospheric pressure.

It is feasible to introduce the etching gas by independently supplying the etching gas components into the reaction chamber or by mixing the etching gas components and supplying the resulting mixed gas into the reaction chamber.

In order to obtain a higher effect regarding etch gas uniformity as well as a higher etch rate, the temperature of the substrate is preferably −30 to 100° C., more preferably −20 to 80° C., still more preferably 0 to 50° C., during the contact of the etching gas to the silicon layer.

The total flow rate of the F atom-containing gas component contained in the etching gas per unit area of the etching target surface of the substrate is preferably 0.3 sccm/cm$^2$ or higher in terms of conversion from the number of F atoms in the molecule to $F_2$. There is a possibility of deterioration in etching depth uniformity if the total flow rate of the F atom-containing gas component is lower than 0.3 sccm/cm$^2$. It is possible to obtain good etching depth uniformity when the total flow rate of the F atom-containing gas component is 0.3 sccm/cm$^2$ or higher. The total flow rate of the F atom-containing gas component is referably 2000 sccm/cm$^2$ or lower in view of the consumption efficiency of the etching gas.

In the case of forming a three-dimensional semiconductor device on the substrate, the hole or groove is defined in the laminated film by reactive ion etching etc. in the direction perpendicular to the substrate surface. The diameter of the hole or the width of the groove is generally of the order of 10 nm to 500 nm. The functions of capacitors or transistors are imparted by the laminated structure of the silicon layers and the insulating layers appearing on the inner surface of the hole or groove so as to provide a higher integration density to the semiconductor device.

The etching time is preferably 30 minutes or less in view of the manufacturing process efficiency of semiconductor devices. Herein, the etching time refers to a time from the introduction of the etching gas into the reaction chamber, in which the substrate is placed and subjected to etching treatment, to the discharge of the etching gas from the reaction chamber by a vacuum pump etc. for completion of the etching treatment.

There is no particular limitation on the etching depth of the silicon layers. The etching depth of the silicon layers is preferably in a range of 5 to 90 nm in order to obtain good process characteristics in the subsequent film forming process for manufacturing of three-dimensional semiconductor devices. The smaller the variations in etching depth between the respective silicon layers in the depth direction of the hole or groove, the better the characteristics of the semiconductor device.

EXAMPLES

FIG. 1 is a schematic system diagram of an etching apparatus used in the following etching tests. In the etching apparatus, a reaction chamber 1 had a stage 5 to support thereon a test sample 7. The stage 5 was equipped with a stage temperature adjusting unit 6 so as to adjust the temperature of the stage 5. A gas line 41 for gas introduction and a gas line 42 for gas discharge were connected to the reaction chamber 1. An interhalogen supply system 21, a $F_2$ supply system 22 and a diluent gas supply system 23 were connected to the gas line 41 via valves 31, 32 and 33, respectively. A vacuum pump 8 was connected to the gas line 42 via a valve 33. Further, a pressure gauge (not shown) was disposed adjacent to the reaction chamber 1 such that the pressure inside the reaction chamber 1 was controlled by the valve 33 based on an indication value of the pressure gauge.

Figure 2:
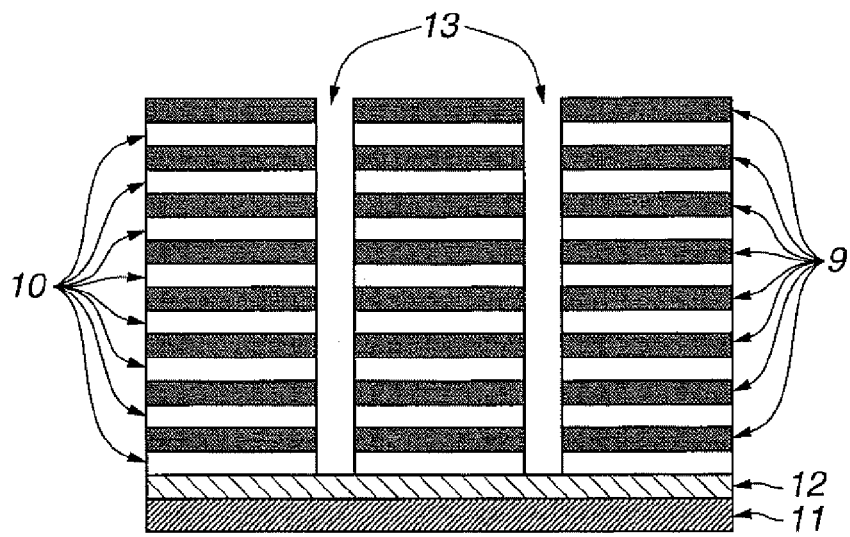
FIG. 2 is a schematic section view of a test sample before etching.

FIG. 2 is a schematic view showing a cross section of the test sample 7 used in the etching test. The test sample 7 included a silicon substrate 11 of 20 mm square (substrate surface area: 4 cm$^2$) and 0.1 mm thickness, a silicon nitride film 12 formed on the silicon substrate 11 and having a thickness of 30 nm and a laminated film formed on the silicon nitride film 12 and in which silicon oxide films 9 and polysilicon films 10, sixteen films in total and each having a thickness of 30 nm, were alternately laminated together. Holes 13 were made with a predetermined diameter D in the laminated film, so as to extend to the silicon nitride film 12 in a direction perpendicular to a surface of the substrate, at evenly spaced intervals of 400 nm in vertical and horizontal directions.

Next, the etching operation will be explained. The test sample 7 was first placed on the stage 5. The reaction chamber 1 and the gas lines 41 and 42 were vacuumed to a degree of lower than 10 Pa. After that, the temperature of the stage 5 was set to a predetermined value. After confirming that the temperature of the stage 5 was set to the predetermined value, the valves 31, 32 and 33 were opened so as to supply predetermined amounts of gases from the interhalogen supply system 21, the $F_2$ supply system 22 and the diluent gas supply system 23 to the reaction chamber 1 through the gas line 41, respectively. The partial pressures of the interhalogen gas, $F_2$ gas and diluent gas were set to their respective target values by adjusting the ratio of the flow rates of the interhalogen gas, $F_2$ gas and diluent gas in the etching gas and the pressure inside the reaction chamber 1. Herein, the total flow rate of the F atom-containing gas component contained in the etching gas per unit area of the etching target surface of the substrate was determined in terms of $F_2$ based on the total flow rate of the etching gas, the partial pressures of the respective gas components and the substrate surface area of the test sample 7.

After the lapse of a predetermined time (etching time) from the introduction of the etching gas, the introduction of the etching gas was stopped. After the inside of the reaction chamber 1 was vacuumed, the test sample 7 was taken out of the reaction chamber 1 and observed for the cross-sectional profiles of the holes by SEM.

In the cross-sectional SEM observation, the etching depths t of the respective polysilicon layers on the wall surfaces of the sixteen layers in the same hole were measured as the silicon etching form. Then, an average value to and a standard deviation a of the etching depths t was determined. A factor π/tA was calculated from these determination results. The uniformity of etching depth in the depth direction of the hole was evaluated based on the factor σ/tA.

Figure 3:
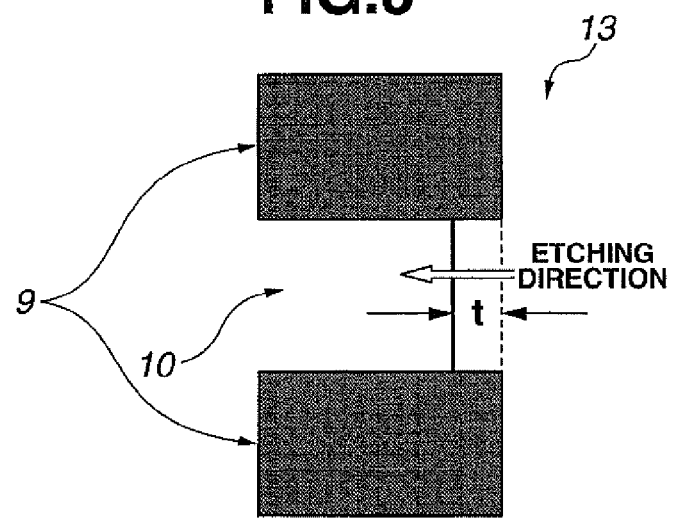
FIG. 3 is a schematic enlarged section view of a hole portion of the test sample after etching.

FIG. 3 is a schematic section view of the polysilicon layer present on the inner surface of the hole 13 after the etching treatment, which shows the etching depth t of the polysilicon layer. The polysilicon layer was in the form of the polysilicon film 10 sandwiched between the silicon oxide films 9. The part of the polysilicon layer appearing on the inner surface of the hole 13 was eroded into a concave shape by the etching treatment. Herein, the etching depth refers to, on the inner surface of the hole, a distance from the non-etched wall surface of the silicon oxide film 9 (corresponding to the same position as the surface of the polysilicon film 10 before the etching treatment) to the concave etched surface of the polysilicon film 10.

The conditions and results of the etching tests of Examples 1 to 32 are shown in TABLE 1.

In Examples 1 to 5, the etching test was conducted under the conditions that: the substrate temperature was set to 20° C.; $ClF_3$ was used as the interhalogen gas; $N_2$ was used as the diluent gas; the partial pressure of $F_2$ was fixed at 10 Pa; and the partial pressure of $ClF_3$, the partial pressure of $N_2$ and the etching time were set to values shown in TABLE 1. In the etching test, the diameter D of the holes 13 of the test sample was 100 nm; and the total flow rate of the etching gas was 5000 sccm.

In Examples 6 to 9, the etching test was conducted under the conditions that: the substrate temperature was set to 20° C.; $ClF_3$ was used as the interhalogen gas; $N_2$ was used as the diluent gas; the partial pressure of $ClF_3$ was fixed at 10 Pa; and the partial pressure of $F_2$, the partial pressure of $N_2$ and the etching time were set to values shown in TABLE 1. In the etching test, the diameter D of the holes 13 of the test sample was 100 nm; and the total flow rate of the etching gas was 5000 sccm.

In Examples 10 to 14, the etching test was conducted under the conditions that: $ClF_3$ was used as the interhalogen gas; $N_2$ was used as the diluent gas; the partial pressure of $ClF_3$ and the partial pressure of $F_2$ were each fixed at 10 Pa; the partial pressure of $N_2$ was fixed at 980 Pa; the total pressure of the etching gas was fixed at 1000 Pa; and the substrate temperature and the etching time were set to values shown in TABLE 1. In the etching test, the diameter D of the holes 13 of the test sample was 100 nm; and the total flow rate of the etching gas was 5000 sccm.

In Examples 15 to 19, the etching test was conducted under the conditions that: the substrate temperature was set to 20° C.; the etching time was set to 3 minutes; either $BrF_3$, $BrF_5$, $IF_5$, $IF_7$ or mixed gas of $ClF_3$ and $IF_7$ was used as the interhalogen gas; $N_2$ was used as the diluent gas; the partial pressure of $BrF_3$, $BrF_5$, $IF_5$, $IF_7$, $ClF_3$ and the partial pressure of $F_2$ were each fixed at 10 Pa; and the partial pressure of $N_2$ was set to a value shown in TABLE 1. In the etching test, the diameter D of the holes 13 of the test sample was 100 nm; and the total flow rate of the etching gas was 5000 sccm.

In Examples 20 and 21, the etching test was conducted under the conditions that: the substrate temperature was set to 20° C.; the etching time was set to 3 minutes; $ClF_3$ was used as the interhalogen gas; the partial pressure of $ClF_3$ and the partial pressure of $F_2$ were each fixed at 10 Pa; the total pressure of the etching gas was fixed at 4990 Pa; and Ar or He was used as the diluent gas. In the etching test, the diameter D of the holes 13 of the test sample was 100 nm; and the total flow rate of the etching gas was 5000 sccm.

In Examples 22 and 23, the etching test was conducted under the conditions that: the substrate temperature was set to 20° C.; the etching time was set to 3 minutes; $ClF_3$ was used as the interhalogen gas; $N_2$ was used as the diluent gas; the partial pressure of $ClF_3$ and the partial pressure of $F_2$ were each fixed at 10 Pa; the total pressure of the etching gas was fixed at 1000 Pa; and the diameter D of the holes 13 was changed to 30 nm or 200 nm. In the etching test, the total flow rate of the etching gas was 5000 sccm.

In Examples 24 to 26, the etching test was conducted under the conditions that: the substrate temperature was set to 20° C.; $ClF_3$ was used as the interhalogen gas; $N_2$ was used as the diluent gas; the partial pressure of $ClF_3$ and the partial pressure of $F_2$ were each fixed at 10 Pa; and the partial pressure of the diluent gas and the etching time were set to values shown in TABLE 1. In the etching test, the diameter D of the holes 13 of the test sample was 100 nm; and the total flow rate of the etching gas was 5000 sccm.

In Example 27, the etching test was conducted under the same conditions as in Example 2, except that the partial pressure of $ClF_3$ was set to 0.5 Pa.

In Example 28, the etching test was conducted under the same conditions as in Example 6, except that the partial pressure of $F_2$ was set to 0.5 Pa.

In Example 29, the etching test was conducted under the same conditions as in Example 1, except that: no diluent gas was used; and the etching time was set to 1 minute.

In Example 30, the etching test was conducted under the same conditions as in Example 1, except that: the $F_2$ conversion value of the total flow rate of the F atom-containing gas component in the etching gas was adjusted to 0.3 sccm/$cm^2$ by setting the partial pressure of the diluent gas $N_2$ to 100000 Pa; and the etching time was set to 20 minutes.

In Example 31, the etching test was conducted under the same conditions as in Example 4, except that the $F_2$ conversion value of the total flow rate of the F atom-containing gas component in the etching gas was adjusted to 3387.5 sccm/$cm^2$ by setting the total flow rate of the etching gas to 10000 sccm.

In Example 32, the etching test was conducted under the same conditions as in Example 4, except that the $F_2$ conversion value of the total flow rate of the F atom-containing gas component in the etching gas was adjusted to 10162.5 sccm/$cm^2$ by setting the total flow rate of the etching gas to 30000 sccm.

In each example, the factor σ/tA was smaller than or equal to 20% even though the average etching depth to was varied from example to example. It has thus been shown that the silicon layer had good uniformity of etching depth in each example.

TABLE 1

| | Interhalogen | | $F_2$ | Diluent gas | | Total flow rate of F atom-containing gas |
|---|---|---|---|---|---|---|
| | Kind | Partial pressure | Partial pressure | Kind | Partial pressure | (sccm/cm$^2$; $F_2$ conversion value) |
| Example 1 | ClF$_3$ | 10 Pa | 10 Pa | N$_2$ | 3980 Pa | 7.8 |
| Example 2 | ClF$_3$ | 2 Pa | 10 Pa | N$_2$ | 3988 Pa | 4.1 |
| Example 3 | ClF$_3$ | 1000 Pa | 10 Pa | N$_2$ | 2990 Pa | 471.9 |
| Example 4 | ClF$_3$ | 1800 Pa | 10 Pa | N$_2$ | 190 Pa | 1693.8 |
| Example 5 | ClF$_3$ | 2500 Pa | 10 Pa | N$_2$ | 490 Pa | 1566.7 |
| Example 6 | ClF$_3$ | 10 Pa | 2 Pa | N$_2$ | 1988 Pa | 10.6 |
| Example 7 | ClF$_3$ | 10 Pa | 1000 Pa | N$_2$ | 990 Pa | 634.4 |
| Example 8 | ClF$_3$ | 10 Pa | 1800 Pa | N$_2$ | 990 Pa | 810.2 |
| Example 9 | ClF$_3$ | 10 Pa | 2500 Pa | N$_2$ | 1490 Pa | 785.9 |
| Example 10 | ClF$_3$ | 10 Pa | 10 Pa | N$_2$ | 980 Pa | 31.3 |
| Example 11 | ClF$_3$ | 10 Pa | 10 Pa | N$_2$ | 980 Pa | 31.3 |
| Example 12 | ClF$_3$ | 10 Pa | 10 Pa | N$_2$ | 980 Pa | 31.3 |
| Example 13 | ClF$_3$ | 10 Pa | 10 Pa | N$_2$ | 980 Pa | 31.3 |
| Example 14 | ClF$_3$ | 10 Pa | 10 Pa | N$_2$ | 980 Pa | 31.3 |
| Example 15 | BrF$_3$ | 10 Pa | 10 Pa | N$_2$ | 3980 Pa | 7.8 |
| Example 16 | BrF$_5$ | 10 Pa | 10 Pa | N$_2$ | 3980 Pa | 10.9 |
| Example 17 | IF$_5$ | 10 Pa | 10 Pa | N$_2$ | 3980 Pa | 10.9 |
| Example 18 | IF$_7$ | 10 Pa | 10 Pa | N$_2$ | 3980 Pa | 14.1 |
| Example 19 | ClF$_3$ + IF$_7$ | 10 Pa + 10 Pa | 10 Pa | N$_2$ | 970 Pa | 75.0 |
| Example 20 | ClF$_3$ | 10 Pa | 10 Pa | Ar | 4970 Pa | 6.3 |
| Example 21 | ClF$_3$ | 10 Pa | 10 Pa | He | 4970 Pa | 6.3 |
| Example 22 | ClF$_3$ | 10 Pa | 10 Pa | N$_2$ | 980 Pa | 31.3 |
| Example 23 | ClF$_3$ | 10 Pa | 10 Pa | N$_2$ | 80 Pa | 31.3 |
| Example 24 | ClF$_3$ | 10 Pa | 10 Pa | N$_2$ | 980 Pa | 312.5 |
| Example 25 | ClF$_3$ | 10 Pa | 10 Pa | N$_2$ | 4980 Pa | 31.3 |
| Example 26 | ClF$_3$ | 10 Pa | 10 Pa | N$_2$ | 3988 Pa | 6.3 |
| Example 27 | ClF$_3$ | 0.5 Pa | 10 Pa | N$_2$ | 1988 Pa | 3.4 |
| Example 28 | ClF$_3$ | 10 Pa | 0.5 Pa | N$_2$ | 0 Pa | 9.7 |
| Example 29 | ClF$_3$ | 10 Pa | 10 Pa | — | 100000 Pa | 1562.5 |
| Example 30 | ClF$_3$ | 10 Pa | 10 Pa | N$_2$ | 190 Pa | 0.3 |
| Example 31 | ClF$_3$ | 1800 Pa | 10 Pa | N$_2$ | 190 Pa | 3387.5 |
| Example 32 | ClF$_3$ | 1800 Pa | 10 Pa | N$_2$ | | 10162.5 |

| | Substrate temperature | Hole diameter D | Etching time | Average etching depth tA | Standard deviation σ | σ/tA |
|---|---|---|---|---|---|---|
| Example 1 | 20° C. | 100 nm | 3 min. | 21 nm | 2.7 | 13% |
| Example 2 | 20° C. | 100 nm | 12 min. | 19 nm | 2.5 | 13% |
| Example 3 | 20° C. | 100 nm | 0.5 min. | 42 nm | 5.2 | 12% |
| Example 4 | 20° C. | 100 nm | 0.5 min. | 53 nm | 9.1 | 17% |
| Example 5 | 20° C. | 100 nm | 0.5 min. | 61 nm | 11.9 | 20% |
| Example 6 | 20° C. | 100 nm | 3 min. | 21 nm | 2.7 | 13% |
| Example 7 | 20° C. | 100 nm | 0.5 min. | 45 nm | 6.0 | 13% |
| Example 8 | 20° C. | 100 nm | 0.5 min. | 45 nm | 7.2 | 16% |
| Example 9 | 20° C. | 100 nm | 0.5 min. | 47 nm | 9.1 | 19% |
| Example 10 | −10° C. | 100 nm | 10 min. | 19 nm | 2.2 | 12% |
| Example 11 | −40° C. | 100 nm | 30 min. | 6 nm | 1.2 | 20% |
| Example 12 | 70° C. | 100 nm | 3 min. | 26 nm | 3.5 | 13% |
| Example 13 | 90° C. | 100 nm | 3 min. | 31 nm | 5.3 | 17% |
| Example 14 | 110° C. | 100 nm | 2 min. | 29 nm | 5.9 | 20% |
| Example 15 | 20° C. | 100 nm | 3 min. | 19 nm | 3.5 | 18% |
| Example 16 | 20° C. | 100 nm | 3 min. | 21 nm | 2.9 | 14% |
| Example 17 | 20° C. | 100 nm | 3 min. | 19 nm | 2.8 | 15% |
| Example 18 | 20° C. | 100 nm | 3 min. | 21 nm | 2.8 | 13% |
| Example 19 | 20° C. | 100 nm | 3 min. | 24 nm | 3.0 | 13% |
| Example 20 | 20° C. | 100 nm | 3 min. | 21 nm | 2.7 | 13% |
| Example 21 | 20° C. | 100 nm | 3 min. | 22 nm | 2.6 | 12% |
| Example 22 | 20° C. | 30 nm | 3 min. | 17 nm | 2.2 | 13% |
| Example 23 | 20° C. | 200 nm | 3 min. | 24 nm | 3.1 | 13% |
| Example 24 | 20° C. | 100 nm | 2 min. | 22 nm | 2.9 | 13% |
| Example 25 | 20° C. | 100 nm | 2.5 min. | 21 nm | 2.9 | 14% |
| Example 26 | 20° C. | 100 nm | 3 min. | 18 nm | 2.6 | 14% |
| Example 27 | 20° C. | 100 nm | 12 min. | 6 nm | 1.2 | 20% |
| Example 28 | 20° C. | 100 nm | 3 min. | 22 nm | 4.1 | 19% |
| Example 29 | 20° C. | 100 nm | 1.0 min. | 19 nm | 2.9 | 15% |
| Example 30 | 20° C. | 100 nm | 20 min. | 18 nm | 3.0 | 17% |
| Example 31 | 20° C. | 100 nm | 0.5 min. | 54 nm | 9.3 | 17% |
| Example 32 | 20° C. | 100 nm | 0.5 min. | 52 nm | 8.8 | 17% |

Comparative Examples 1 to 6

The conditions and results of the etching tests of Comparative Examples 1 to 6 are shown in TABLE 2.

In Comparative Example 1, the etching test was conducted under the same conditions as in Example 1, except that the partial pressure of $F_2$ was set to 0 Pa.

In Comparative Example 2, the etching test was conducted under the same conditions as in Example 7, except that the partial pressure of $ClF_3$ was set to 0 Pa.

In Comparative Example 3, the etching test was conducted under the same conditions as in Example 3, except that: the partial pressure of $F_2$ was set to 0 Pa; and no diluent gas was used.

In Comparative Example 4, the etching test was conducted under the same conditions as in Example 3, except that the partial pressure of $F_2$ was set to 0 Pa.

In Comparative Example 5, the etching test was conducted under the same conditions as in Example 5, except that the partial pressure of $F_2$ was set to 0 Pa.

In Comparative Example 6, the etching test was conducted under the same conditions as in Example 9, except that the partial pressure of $ClF_3$ was set to 0 Pa.

In each comparative example, the factor σ/tA exceeded 20%. It has thus been shown that the silicon layer had poor uniformity of etching depth in each comparative example.

the embodiments described above will occur without departing from the scope of the present invention.

INDUSTRIAL APPLICABILITY

The present invention is effective in, in the manufacturing of a semiconductor device having a laminated structure of silicon layers formed with holes or grooves, processing the semiconductor device into a three-dimensional structural model in which semiconductor elements are arranged in direction parallel and perpendicular to the substrate surface for increase of integration.

DESCRIPTION OF REFERENCE NUMERALS

1: Reaction Chamber
21: Interhalogen Supply System
22: $F_2$ Supply System
23: Diluent Gas Supply System
31, 32, 33: Valve
41, 42: Gas Line
5: Stage
6: Stage Temperature Adjusting Unit
7: Test Sample
8: Vacuum Pump
9: Silicon Oxide Film

TABLE 2

| | Interhalogen | | $F_2$ | Diluent gas | | Total flow rate of F atom-containing gas |
|---|---|---|---|---|---|---|
| | Kind | Partial pressure | Partial pressure | Kind | Partial pressure | (sccm/cm²; $F_2$ conversion value) |
| Comparative Example 1 | $ClF_3$ | 10 Pa | 0 Pa | $N_2$ | 3990 Pa | 4.7 |
| Comparative Example 2 | — | 0 Pa | 1000 Pa | $N_2$ | 4000 Pa | 250.0 |
| Comparative Example 3 | $ClF_3$ | 1000 Pa | 0 Pa | — | — | 1875.0 |
| Comparative Example 4 | $ClF_3$ | 1000 Pa | 0 Pa | $N_2$ | 3000 Pa | 468.8 |
| Comparative Example 5 | $ClF_3$ | 2500 Pa | 0 Pa | $N_2$ | 3000 Pa | 852.3 |
| Comparative Example 6 | — | 0 Pa | 2500 Pa | $N_2$ | 3000 Pa | 568.2 |

| | Substrate temperature | Hole diameter D | Etching time | Average etching depth tA | Standard deviation σ | σ/tA |
|---|---|---|---|---|---|---|
| Comparative Example 1 | 20° C. | 100 nm | 3 min. | 19 nm | 5.2 | 27% |
| Comparative Example 2 | 20° C. | 100 nm | 10 min. | 21 nm | 6.4 | 30% |
| Comparative Example 3 | 20° C. | 100 nm | 0.5 min. | 49 nm | 15 | 31% |
| Comparative Example 4 | 20° C. | 100 nm | 0.5 min. | 42 nm | 18 | 43% |
| Comparative Example 5 | 20° C. | 100 nm | 0.2 min. | 53 nm | 24 | 45% |
| Comparative Example 6 | 20° C. | 100 nm | 10 min. | 48 nm | 18 | 38% |

As described above, it is possible to prevent non-uniformity of dry etching depth between the silicon layers by the dry etching method of the present invention.

Although the present invention has been described above with reference to the specific exemplary embodiments, the present invention is not limited to the above-described exemplary embodiments. Various modifications and variations of 10: Polysilicon Film
11: Silicon Substrate
12: Silicon Nitride Film
13: Hole

The invention claimed is:

1. A dry etching method for a laminated film comprising etching parts of silicon layers appearing on an inner surface of a hole or groove of a laminated film with an etching gas, wherein the etching gas comprises: at least one kind of gas selected from the group consisting of $ClF_3$, $BrF_5$, $BrF_3$, $IF_7$ and $IF_5$; and $F_2$; and wherein the laminated film is formed on a substrate and has a laminated structure wherein silicon layers and insulating layers are laminated together with a hole or groove defined therein in a direction perpendicular to a surface of the substrate.

2. The dry etching method according to claim 1, wherein the partial pressure of $ClF_3$, $BrF_5$, $BrF_3$, $IF_7$ or $IF_5$ in the etching gas is 1 to 200 Pa.

3. The dry etching method according to claim 2, wherein the etching gas further comprises: at least one kind of gas selected from $N_2$, He and Ar.

4. The dry etching method according to claim 2, wherein the etching gas is brought into contact with the substrate under the condition that the temperature of the substrate is −30 to 100° C.

5. The dry etching method according to claim 1, wherein the etching gas further comprises: at least one kind of gas selected from $N_2$, He and Ar.

6. The dry etching method according to claim 5, wherein the etching gas is brought into contact with the substrate under the condition that the temperature of the substrate is −30 to 100° C.

7. The dry etching method according to claim 1, wherein the etching gas is brought into contact with the substrate under the condition that the temperature of the substrate is −30 to 100° C.

* * * * *